United States Patent Office 3,486,891

Patented Dec. 30, 1969

3,486,891

PRODUCTION OF PRINTING PLATES

Hans Wilhelm, Ludwigshafen (Rhine), Herbert Henkler, Darmstadt, and Josef Georg Floss, Ludwigshafen (Rhine), Germany, assignors to Badische Anilin- & Soda-Fabrik Aktiengesellschaft, Ludwigshafen (Rhine), Germany No Drawing. Filed Aug. 2, 1966, Ser. No. 569,590
Claims priority, application Germany, Aug. 4, 1965, 1,447,928
Int. Cl. C08g *41/04;* G03c *5/00, 1/68*
U.S. Cl. 96—35.1 5 Claims

ABSTRACT OF THE DISCLOSURE

A process for the production of a printing plate or sheet by (1) exposing to light through a negative or positive an initial plate or sheet consisting essentially of (A) an alcohol-soluble linear synthetic polyamide which is free of photopolymerizable double bonds and (B) a monomeric compound containing at least one photopolymerizable double bond and also at least one reactive hydrogen atom, as represented for example by a hydroxy substituent which is known to be highly reactive with isocyanates at room temperature or at moderately elevated temperatures, e.g., up to not more than 85–100° C., then (2) treating the exposed plate or sheet with a polyisocyanate for reaction with the reactive hydrogen atoms, and subsequently (3) washing the plate or sheet with an alcoholic solution for removal of unexposed areas thereof.

This invention relates to printing plates and to a process for their production.

It is known that printing plates can be prepared by exposing plates or sheets of mixtures of soluble polyamides and compounds having photopolymerizable double bonds, polymerization initiators and if desired polymerization inhibitors which prevent thermal polymerization, to light through a negative or positive and removing the unexposed areas by conventional solvents, for example boiling methanol which may contain calcium chloride, down to the desired depth. Polyamides used in the conventional methods in general have poor compatibility with the photopolymerizable monomers. Printing plates are often obtained which have unsatisfactory image sharpness.

It is also already known that printing plates may be made from plates and sheets consisting of mixtures of linear copolyamides, which contain etherified N-methylol groups, and photopolymerizable monomers. It has thus been possible in some cases to achieve higher concentrations of monomers, but the time-consuming and difficultly controllable reaction of the polyamide with formaldehyde and alcohols which sometimes leads to undesirable byproducts had to be put up with.

We have now found that printing plates can be advantageously prepared by exposing plates or sheets of mixtures of soluble synthetic polyamides, photopolymerizable compounds having at least one polymerizable double linkage, with or without photoinitiators and/or polymerization inhibitors, to light through a negative or positive and removing unexposed areas down to the desired depth by using plates or sheets consisting of 99 to 40% by weight of a soluble polyamide and 1 to 60% by weight of a compound having at least one photopolymerizable double bond and at least one hydrogen atom which will react with isocyanates, and treating the exposed plates or sheets with polyisocyanates prior to removal of the unexposed areas.

Printing plates are obtained which have outstanding sensitivity to light. Another advantage of such printing plates is the feature associated with the high monomer concentration, namely a very sharp relief image with a favorable shoulder shape. The method also permits variation within wide limits of the hardness of the printing relief by choice of the isocyanates and the type of treatment.

The light sensitivity may in most cases be increased by adding polymerization initiators which can be activated by actinic light, but the presence of these substances is not essential for the process. In many cases it is furthermore recommended to add to the mixtures a conventional inhibitor preventing thermal polymerization in order to suppress undesirable reactions during manufacture and storage of the plates and sheets.

Soluble polyamides to be used according to this invention include all products prepared by polycondensation of dicarboxylic acids with diamines, of aminocarboxylic acids and of lactams by conventional methods. Mixtures of these polyamides and/or copolyamides are also suitable.

Examples of compounds containing in the molecule one or more reactive hydrogen atoms as well as at least one carbon-carbon double bond which is polymerizable by light, which are suitable for the process according to this invention are acrylamide, methacrylamide, N-methylolacrylamide, N-methylolmethacrylamide, α-ethylacrylamide, ethylene glycol monoacrylate, butanediol-(1,4) monoacrylate, diethylene glycol monoacrylate, triethylene glycol monoacrylate, partial esters of polyhydric alcohols with acrylic acid and/or methacrylic acid, β-hydroxyethylene acrylamide, β-hydroxyethylene methacrylamide, hydroxystyrenes or aminostyrenes.

To increase light sensitivity, small amounts of initiators which are activated by actinic light and which initiate and/or accelerate polymerization are added in most cases. The following are suitable compounds for this purpose: vicinal ketaldonyl compounds, for example diacetyl and benzil; α-ketaldonyl alcohols, for example benzoin and pivaloin; acyloin ethers, for example benzoin methyl ether and benzoin ethyl ether; azonitriles, for example 1,1′-azadicyclohexane carbonitrile; α-hydrocarbon-substituted aromatic acyloins, for example α-methylbenzoin and α-allylbenzoin as well as substituted and unsubstituted polynuclear quinones, for example 9,10-anthraquinone, 1-chloroanthraquinone, 2-chloroanthraquinone, 2-methylanthraquinone, 1,4-naphthoquinone and 9,10-phenanthrenequinone. This type of initiator has the advantage of being thermally inactive up to 85° C., in some cases even up to 170° C., so that undesired polymerization reactions during manufacture and storage are avoided.

In some cases it is advantageous to add to the mixtures used according to the invention small amounts of inhibitors which prevent thermal polymerization if the processing conditions include temperatures at which the monomers used tend to undergo thermal polymerization. Stability in storage may also be considerably improved in special cases by adding inhibitors. These inhibitors are often already present in the monomers used and are as a rule antioxidants, such as hydroquinone, p-methoxyphenol or di-tertiary-butyl-p-cresol. They are used in amounts of up to 1% by weight on the monomers.

Exposure of the plates or sheets may be carried out with light sources known in the printing trade, such as carbon arcs, mercury vapor lamps, xenon lamps or fluorescent tubes, i.e. all light sources which emit high-energy light.

To obtain a favorable shoulder shape, it is recommended to expose the plates to strongly divergent light beams. This may be achieved either by exposure with a broad light source at a short distance from the plate or by providing point sources of light, such as carbon arcs, with special reflectors so that the size of the light source is increased. The light source and/or the plate may also be moved during exposure.

Practically all polyisocyanates known from the chemistry of polyurethane manufacture are suitable for the treatment of the plates or sheets with polyisocyanates or solutions thereof which is carried out after exposure. It is essential that this class of compounds should contain two or more NCO groups in the molecule which will react with reactive hydrogen atoms in other molecules. Examples of suitable polyisocyanates are hexamethylene diisocyanate, p-phenylene diisocyanate, 1,5-diisocyanatonaphthalene, 4,4' - diisocyanatodiphenylmethane, 4,4',4''-triisocyanatotriphenylmethane. 2,6 - diisocyanatotoluene or 2,5-diisocyanatotoluene. The physiologically harmless polyisocyanates formed by adding on about three moles of 2,4-diisocyanatotoluene to a triol, such as trimethylolpropane, are very suitable. In cases where better control of the reaction is desired or where the polyisocyanates are solids solutions of the polyisocyanates in inert solvents, such as ethyl acetate, benzene, xylene, ethyl glycol acetate, ethers, such as tetrahydrofuran or dioxane, may be used very successfully.

The exposed plates are treated with polyisocyanates for example by immersing the plates for a few seconds to several hours either in a liquid polyisocyanate or in a dissolved polyisocyanate. The treatment time and the concentration depend on the reactivity of the polyisocyanate chosen and the desired depth of crosslinking of the exposed plate. Liquid polyisocyanates are usually allowed to act on the plates for one to thirty minutes. Polyisocyanate solutions are in general used in concentrations of 5 to 80% by weight. Undesirable secondary reactions may be prevented by shorter treatment times and/or lower concentrations of polyisocyanate solutions. The concentration and the treatment time which are required for the plate being used may be established by a simple experiment.

All solvents or solvent mixtures in which the polyamide is soluble are suitable for washing away the unexposed and uncrosslinked areas of the plates or sheets used according to this invention. These solvents include alcohols, such as methanol, ethanol and propanol; mixtures of alcohol and water, for example 80% aqueous propanol; mixtures of alcohol, benzene and water, for example methanol, benzene and water (7:2:1); mixtures of alcohol and toluene, such as propanol and toluene (1:1); and solutions of calcium chloride in alcohols, such as an 8% solution of calcium chloride in methanol.

Washing may be carried out manually or mechanically by dissolving out, rubbing out or spraying out or by another suitable method. In special cases additives such as plasticizers, inert fillers, pigments, activators and accelerators for the crosslinking reaction as well as other substances which affect the properties of the plates or sheets in a desired way may also be incorporated in the mixtures used according to this invention. In many cases it is suitable to bond the plates or sheets firmly to a rigid or flexible base prior to or after processing in order to facilitate the work of the printer and the chemigrapher. Plates and sheets which have been firmly bonded prior to exposure to a conventional base of metal, plastic, wood, paper, cloth or ceramic in the usual way may be used according to this invention.

The new type of plates or sheets may not only be employed for the production of the conventional flat plates used in letterpress printing, but are also suitable for the manufacture of all types of letterpress relief plates used on rotary machines, for example rotary newspaper machines, sheet-fed rotary machines using wraparound plates, as well as those used in dry offset printing and in intaglio printing.

The invention is illustrated by the following examples in which parts are by weight.

Example 1

The plate used is prepared as follows:

A solution of 100 parts of a copolyamide (prepared by a conventional method by polymerizing a mixture of 35 parts of hexamethylene diammonium adipate, 35 parts of the salt of 4,4'-diaminodicyclohexylmethane and adipic acid and 30 parts of ε-caprolactam), 60 parts of N-methylolacrylamide and 0.6 part of benzoin methyl ether in 280 parts of methanol is poured into dishes and placed in a current of air. After the solvent has evaporated, the coarsely comminuted product is dried for twenty-four hours at room temperature under subatmospheric pressure and then granulated. The granulate is molded at about 170° C. into a plate having a thickness of 1 mm. The colorless transparent plate is exposed for 1 minute in a copying frame through a combined half-tone/line negative by means of four fluorescent tubes (type Philips TLA 40/05) arranged at a distance of 3 cm. The plate is then immersed for five minutes in a 75% solution in ethyl acetate of the triisocyanate prepared by reacting 1 mole of trimethylolpropane with 3 moles of 2,4-diisocyanatotoluene. It is then rinsed with ethyl acetate and brushed for five minutes in a mixture of benzene, methanol and water (2:7:1) with a soft brush. The printing relief is sharp, hard, completely transparent and has a depth of about 0.8 mm. The relief printing plate is fastened to a metal plate with double-coated adhesive film and is suitable for letterpress printing.

Example 2

100 parts of the copolyamide described in Example 1 is dissolved together with 60 parts of N-methylolmethacrylamide, 1 part of benzoin methyl ether and 0.1 part of p-methoxyphenol in 280 parts of methanol at 50° C. The solution is freed from solvent in open dishes and the residue is reduced in size. The granulate is molded at 170° C. into a plate having a thickness of 0.8 mm. on a hydraulic press and further processed as in Example 1. A half-tone relief printing plate is obtained which, after being fastened to a lead backing plate by means of a double-coated adhesive film, is suitable for use on a letterpress machine.

Example 3

100 parts of the copolyamide described in Example 1, 30 parts of N-methylolacrylamide, 20 parts of butanediol monoacrylate, 0.1 part of 9,10-phenanthrenequinone and 0.1 part of p-methoxyphenol are dissolved in 245 parts of methanol at 50° C. The mixture is treated on heatable rollers at 60° C. until the bulk of the solvent has evaporated. The cold sheets are processed into chips and molded at 170° C. on a hydraulic press into a transparent plate pale yellow in color and 1 mm. in thickness. The plate is fastened to an aluminum plate coated with black lacquer with double-coated adhesive film and exposed for three minutes through a combined half-tone/line negative by means of the lamp arrangement described in Example 1. After exposure the plate is immersed for 8 minutes in an 80% solution in ethyl acetate of 2,4- diisocyanatotoluene. After rinsing with ethyl acetate the plate is washed as described in Example 1 with a mixture of benzene, methanol and water. A letterpress printing plate is obtained which gives very good printed copies.

Example 4

100 parts of the copolyamide described in Example 1, 40 parts of N-methylolacrylamide, 20 parts of N-methylolmethacrylamide, 0.8 part of benzoin methyl ether and 0.1 part of p-methoxyphenol are dissolved in 350 parts of methanol at 50° C. The procedure of Example 1 regarding the processing of the product into a colorless, transparent plate 1 mm. in thickness is followed. After exposure the plate is treated for 15 minutes with hexamethylene diisocyanate, rinsed with ethyl acetate and finally fastened to an aluminum plate with double-coated adhesive film. After washing in the presence of a mixture of benzene, methanol and water, as described in Example 1, a printing plate having a very good relief image is obtained.

Example 5

A transparent plate light yellow in color is prepared according to Example 1. However, a solution of 100 parts of copolyamide, 40 parts of N-methylolacrylamide, 10 parts of butanediol monoacrylate, 10 parts of triethylene glycol monoacrylate, 0.1 part of 2-ethylanthraquinone and 0.1 part of p-methoxyphenol in 280 parts of methanol is used instead of that described in Example 1. The plate, after being exposed for 2 minutes through a line negative, is treated for 6 minutes in a 60% solution in ethylene glycol acetate of diphenylmethane-4,4-diisocyanate. After the plate has been rinsed with ethyl acetate, it is fastened to an aluminum plate with double-coated adhesive film and washed as described above in the presence of a solvent mixture of benzene, methanol and water. A printing relief which is very suitable for use on a letterpress machine is obtained.

We claim:

1. In a process for the production of a printing plate by exposing and developing an image from an initial photosensitive printing plate or sheet consisting essentially of a mixture of (A) an alcohol-soluble linear synthetic polyamide, and (B) a monomeric compound containing at least one photopolymerizable double bond, the improvement which comprises:

exposing to light through a negative or positive an initial photosensitive plate or sheet in which the proportion by weight of (A):(B) is from 99:1 to 40:60 and component (B) is a photopolymerizable compound containing at least one reactive hydrogen atom capable of reacting readily with an isocyanate;

treating the resulting exposed plate or sheet with a polyisocyanate for reaction with said reactive hydrogen atoms; and subsequently washing the plate or sheet with an alcoholic solvent for removal of the unexposed areas thereof.

2. A process as claimed in claim 1 wherein component (B) is a photopolymerizable monomeric compound containing at least one hydroxy substituent which represents the reactive hydrogen atom.

3. A process as claimed in claim 2 wherein said component (B) is a compound of the formula $$CH_2{=}CR{-}\overset{\displaystyle O}{\overset{\|}{C}}{-}NH{-}CH_2OH$$

wherein R denotes a member selected from the group consisting of hydrogen and methyl.

4. A process as claimed in claim 2 wherein the polyisocyanate is a diisocyanate of the formula $$O{=}C{=}N{-}R'{-}N{=}C{=}O$$

wherein R′ is a divalent radical selected from the group consisting of hexamethylene and toluylene.

5. A process as claimed in claim 2 wherein a small amount each of a polymerization inhibitor and a photoinitiator is incorporated in the mixture of (A) and (B).

References Cited

UNITED STATES PATENTS

| | | | |
|---|---|---|---|
| 2,948,706 | 8/1960 | Schellenberg et al. | 96—115 X |
| 2,997,391 | 8/1961 | Murray et al. | 96—35.1 |
| 3,103,437 | 9/1963 | Henn et al. | 96—111 |
| 3,147,116 | 9/1964 | Roth | 96—35.1 |
| 3,278,305 | 10/1966 | Laridon et al. | 96—35.1 |

GEORGE F. LESMES, Primary Examiner

R. E. MARTIN, Assistant Examiner

U.S. Cl. X.R.

96—115; 260—857, 859